United States Patent
Fabry et al.

(10) Patent No.: US 7,075,312 B2
(45) Date of Patent: Jul. 11, 2006

(54) METHOD FOR CORRECTING ERRORS BY DE-EMBEDDING DISPERSION PARAMETERS NETWORK ANALYST AND SWITCHING MODULE

(75) Inventors: Hans-Joachim Fabry, Berlin (DE); Holger Heuermann, Holzkirchen (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 498 days.

(21) Appl. No.: 10/467,705

(22) PCT Filed: Feb. 8, 2002

(86) PCT No.: PCT/EP02/01321

§ 371 (c)(1), (2), (4) Date: Sep. 4, 2003

(87) PCT Pub. No.: WO02/065150

PCT Pub. Date: Aug. 22, 2002

(65) Prior Publication Data

US 2004/0064774 A1    Apr. 1, 2004

(30) Foreign Application Priority Data

Feb. 10, 2001   (DE) ................................ 101 06 254

(51) Int. Cl.
    *G01R 15/00*   (2006.01)
(52) U.S. Cl. ..................................... 324/601
(58) Field of Classification Search ................ 324/601
    See application file for complete search history.

(56) References Cited

U.S. PATENT DOCUMENTS

| 5,047,725 | A | * | 9/1991 | Strid et al. ................ 324/601 |
| 5,578,932 | A | | 11/1996 | Adamian |
| 6,188,968 | B1 | * | 2/2001 | Blackham .................... 702/85 |
| 2003/0132758 | A1 | * | 7/2003 | Martens ..................... 324/601 |

FOREIGN PATENT DOCUMENTS

| DE | 38 14 852 A1 | 11/1989 |
| DE | 44 05 211 A1 | 12/1994 |
| EP | 0 430 475 A2 | 6/1991 |

* cited by examiner

*Primary Examiner*—Vincent Q. Nguyen
(74) *Attorney, Agent, or Firm*—Caesar, Rivise, Bernstein, Cohen & Pokotilow, Ltd.

(57) ABSTRACT

The invention relates to a method for correcting errors by de-embedding scattering parameters of a device under test associated with measuring ports (11), the parameters being measured by a vector network analyzer including n measuring ports. The aim of the invention is to create a universal, precise and fast method of correcting errors of scattering parameters. To this end, the method includes the following steps: formula (1) two-port calibrations are carried out on different calibrating standards in any order in the active state between the measuring ports (11), as a basis for a first error correction; the reflection parameters of at least one part of the n measuring ports (11) are determined in the inactive state, by way of the results of two-port measurements carried out on at least one calibrating standard switched in the active and/or inactive state on measuring ports (11), as a basis for a second error correction. The invention also relates to a network analyzer and to a switching module for a network analyzer.

14 Claims, 8 Drawing Sheets

METHOD FOR CORRECTING ERRORS BY DE-EMBEDDING DISPERSION PARAMETERS NETWORK ANALYST AND SWITCHING MODULE

BACKGROUND OF THE INVENTION

The invention concerns a procedure for error correction by the de-embedding of a scattering parameter, which has been measured with an n-port containing, vectorial network analyzer, wherein the scattering parameter relates to a device under test connected to the said ports. The invention also concerns a vectorial network analyzer for the said procedure as well as a circuit module for the said network analyzer.

In high frequency technology, the behavior of circuits is normally described in terms of scattering parameters. The scattering parameters represent complex reflection and transmission parameters of a circuit and join ingoing and outgoing waves with one another. A representation of this type where complex reflection and transmission parameters are concerned is especially well suited to the physical realities of the problems brought forth in high frequency technology.

Thus, for example, a circuit, which is formed by a linear 2-port, and is incorporated in the scattering parameters by means of its scattering matrix [S], can be completely described. If the waves, which respectively run to one port of the 2-port, are designated as $a_1$ and $a_2$ and those waves which depart from respectively one port of the 2-port, and propagate themselves in a reverse direction, are designated by $b_1$ and $b_2$, then, for the scattering matrix [S] the following valid relationship serves:

$$\begin{pmatrix} b_1 \\ b_2 \end{pmatrix} = \underbrace{\begin{pmatrix} S_{11} & S_{12} \\ S_{21} & S_{22} \end{pmatrix}}_{=[S]} \begin{pmatrix} a_1 \\ a_2 \end{pmatrix}$$

Experience in the practice allows it to be known, that for the determination of the scattering parameter, it is advantageous to employ a circuit of a network analyzer to which the circuit of the device under test can be connected. By means of such a network analyzer, the waves approaching the device under test are input and captured at the measurement positions. Likewise, the waves sent in the opposite direction are captured at measurement positions. From these measured values, it is then possible to determine the scattering matrix [S].

The goal of every n-port measurement by means of a network analyzer is to determine the scattering parameter with the greatest precision. In any case, error interferences occur throughout the network analyzer itself, such as, for example, improper interlinkage or mismatching, which falsify the results of measurements.

The precision of the measuring capacity of the network analyzer, can be substantially improved by a system error correction. Where the system error correction is concerned, measurement takes place within a calibration process, this being the so-called calibration standards, that are devices under test, which are partially or fully known. From these measurement values and through special computational paths, one obtains correction data. With these correction data and a corresponding correction computation, one obtains for each device under test from the rough measurement values, corrected scattering parameters, which are then free from the said system error of the network analyzer.

De-embedding is to be understood as a situation wherein after a calibration has been made as described, one has obtained scattering parameters, which are not yet sufficiently error-free, and subsequently the said scattering parameters are subjected to a second measurement correction. This can be, in the simplest case, a multiplication with an inverse chain matrix of a known circuit line between the network analyzer and the device under test. As a rule, a good calibration in the reference planes of the device under test is more exact than an additional de-embedding step. However, a calibration is often time consuming and complex, and in many cases the exactness of a de-embedding step is sufficient. In the literature, de-embedding is designated as a "Two-Tier-Calibration", which also makes clear, that when de-embedding is practiced, a two-stage calibration, i.e. a two-stage error-corrective measure of the raw measured values is being undertaken.

Principally, network analyzers are a means of measuring electronic equipment of one and 2-port parameters in a range of, for instance, electronic semiconductor components to antennas. These 1-port and 2-port calibration procedures form, however, no fully sufficient basis for error correction in the measurement of multiport objects. One problem with multiport measurement is found therein, in that, namely all ports of the device under test are interlinked.

Thus, one cannot obtain, from a single point of measurement, a value for the waves departing, then at the next measuring point, achieve a value for the reflected wave, and finally at a third measurement point, pick up a value for a transmitted wave, which value would be independent of the connection terminals of the multiport device.

However, for several years, network analyzers with a nearly optionally large number n of measuring ports have been put to use for the detection of the complex reflection and transmission characteristics of multiport devices under test. Procedures in accord with this have been described in the documents DE 199 18 697 A1 and DE 199 18 960 A1. DE 199 18 960 A1 is based on the use of a 7-term-procedure for 2-port measuring, and DE 199 18 697 A1 is based on the use of a 10-term procedure for 2-port measuring. The calibration procedures presented in the said documentation for the error module for n-port network analyzers are direct multiport calibration procedures, which, to be sure, are exact, but however, with which, in practice, the necessary measurements and corrections are very time consuming. The result of this is, that these procedures cannot be employed for network analyzers, which exhibit three or four measurement positions, which by means of two inner ports and a circuit matrix are connected with the ports of the device under test. These network analyzers present, however, by far the largest group of applied network analyzers.

In modern network analyzers with four measuring positions, there has been one in the dissertation publication "*Safe Procedure for the Calibration of Network Analyzers for Coaxial and Planar Line Systems*", Institute for High Frequency Technology, Ruhr University, Bochum, 1995, from H. Heuermann's descriptive TRL, i.e. "*Through Line Reflectance Calibration Procedure*". In this procedure, there is required, aside from the through connection T, the remaining two standards L and R, which need be only partially known. In the said publication, however, it has been shown, that the TRL-procedure can be seen as essentially a special case of a general theory for the so-called "two error matrix 2-port model".

As devices under test of multiport measurements, first, there is a series of objects with unsymmetrical terminal connections (as a rule, 50 Ω-ports) such as couplers, signal parts, and frequency selective filters, and second, objects to be considered with connection terminals of various types, such as, for instance, symmetrical members and SAW-filters (i.e., Surface Acoustic Wave filters). In the case of the latter, the state of the technology is, that the differential mode, by means of an additional working step under the limitations of an ideal transformer is retroconverted into an unsymmetrical mode.

Thus, the invention has the purpose of making available a procedure, a network analyzer and a circuit module, which permit a universally applicable, exact and non-time consuming error correction of the scattering parameters of a device under test, as measured by means of a network analyzer.

SUMMARY OF THE INVENTION

Between the pairs of n ports of a network analyzer, by appropriate connection, a calibration standard signal path can be formed. Where n ports are concerned, $$k = n \cdot \frac{n+1}{2}$$

various combinations of pairs of ports are possible, and therewith, also k of such signal paths per pair of ports. The necessary capture means for the 2-port calibration from signals approaching the ports, and those signals emitted from the ports can be optionally constructed. Thus, the n ports of the network analyzer can be connected both by a circuit matrix and inner ports with 3 or 4 measuring positions, as well as being connected by only one switch matrix with 3, 4 or n−1 measuring positions, and as well, even without a switch matrix directly to 2·n measuring positions.

Calibration standards may be established as in the known calibration procedures involving n-ports, 2-ports, and/or single to n times ports, which, with one exception, are advantageously completely known, or are self-calibration. As is discussed in greater detail in the above said dissertation document, standards with self-calibration capabilities are, at this time, only based on 2-port standards, which are measured with at least 4 measuring positions. The exception mentioned above consists, as in the known 2-port calibration procedure, of at least one, required 2-port, limited transmission damping, which is not advantageously completely known or is self-calibration.

If, however, the transmission damping of this 2-port becomes known, then, correspondingly installed n-times single ports need not be completely known. The n-times 1-ports, which are capable of being installed in the invented procedure and in the invented network analyzer with the rank of a calibration standard, can be either an n-port consisting of n 1-ports, or a 1-port which is connected and measured at each of the n-ports.

The invention bases itself on the 2-port calibration procedure implemented in known network analyzers. After such a known calibration procedure for the availability of error terms for a first error correction has been carried out, the invention allows, by means of a very simple, additional de-embedding step with only a few measurements, the obtaining of exact multiport values, which give indications on the multiport behavior of the device under test.

For each port, various reflection factors exist for various conditions. Active states are given, when the port is switched to send or receive. An inactive port exists, when the port is shut off. The known 2-port calibration procedures determine and make use of exclusively the reflection parameters of 2-port in the active state. Thereby, in any case, the correlations between the n-ports cannot be taken into consideration, which determine the multiport behavior of the device under test.

The proposed de-embedding step is found therein, in that after a known k-times 2-port calibration, the reflection factors of at least some of the n-ports of the network analyzer are to be determined in the shutoff condition. This determination is executed with the results of the 2-port measurements on at least one calibration standard connected at the ports in the active and/or the inactive state.

For network analyzers, which principally possess three or four measuring positions, which are connected by two inner ports with the n measurement ports, the inactive and the active reflection behavior of the ports are different. In the case of such network analyzers the inactive reflection factors are determined, while respectively, on the sender side the reflections of the 2-port are measured. During this time, the port, which functions otherwise as a receiver, is shut off. Additionally, if the measured inactive reflection factors are freed of error, then, particularly because of the connected calibration standard between the ports the measured factor diverts from the actually inactive reflection factor. In this case, the 2-port are additionally measured in both directions with the same calibration standard, while respectively; one port is a sender and the other port functions as a receiver. Furthermore, both ports are switched to the active state. The measurement results can then be applied to extinguishing the error of the measured inactive reflection parameter.

For network analyzers, which exhibit 2·n or n+1 measuring positions, the active and the inactive reflection behaviors of the ports are identical. On this account, in this case it becomes necessary to exclusively measure the 2-port, while both ports are switched to active. In regard to determined reflection parameters of the ports in the inactive state, then simply, the reflection parameter of the ports in the active state can be used.

The determined reflection parameters of the ports in the inactive state can then form a base for a second error correction of the scattering parameter by which the multiport behavior can be estimated with a high degree of precision. With the proposed procedure, messages, decontaminated of crosstalk and faulty mix can be carried out, both in coaxial systems as well as in semiconductor substrates.

Being based on the invented procedure and the invented network analyzer, that is to say, the circuit module, it is possible, from the now available 2-port-solution to very rapidly convert complex multiport solutions for the network analyzer. This requires far less loss of time than the known multiport procedure. The invented procedure presents, in this way, a De-embedding, Multiport Procedure (hereinafter, "DMV"), which essentially is less expensive than the known multiport calibration procedure based on a few calibrations. Very importantly, the invention permits applications on network analyzers, which have 3 or 4 measurement positions and wherein a switching matrix is connected to the gates, which are not possible with the known multiport calibration procedure.

A particular advantage of the proposed procedure lies in the simple possibilities of implementation in a network analyzer. Further, the procedure has superiorities over the known multiport-calibration method, in that not all signal paths need be measured, if only one or a few scattering parameters are being sought. For a comprehensive error correction of a scattering matrix of a device under test, however, all k possible signal paths between two ports must be measured and therefrom the reflection parameters of combined ports in the active state are determined.

The claims of the here presented procedure regarding the calibration standards are the same as in the case of known 2-port and multiport calibration method. This is a very important aspect for the availability of the calibration standard and thus also for the practical application thereof. Since the presented procedure permits the application of a very large number of calibration standards, this has the result of enabling in each circuit a possibility for the precise realization of the said standards and thereby an entirely new perspective in the measurement of a plurality of ports.

Even when the reflection factors of all n ports should be measured, the number of the necessary contacts of individual standards in the case of the proposed procedure is not greater than is the case with the multiport, 10-term-method from DE 199 18 697 A1. Only, in comparison to the said multiport, 7-term-method from DE 199 18 960 A1, additional connections are called for.

Advantageous embodiments of the invented procedure and the network analyzer are evident in the subordinate claims.

In a preferred embodiment of the invented procedure, for the determination of the reflection factors of 2-port in the inactive state, the through connections are maintained as in the case of the established 2-port calibration in accord with a known procedure, so that no additional connection effort is necessary. However, as compared to a basic 2-port, 7-term method, a reduced connection expense is gained. Moreover, the already established results obtained from the said through connection calibrations of the 2-ports in the active state can be used. Depending on the network analyzer, for each reflection parameter to be determined of a port a further 2-port measurement with respectively a switched off port must be carried out in the inactive state. However, essentially, much more time consuming than the measurements themselves is the making of new connections. The invented procedure also permits the de-embedding step with the inclusion of carrying out the implementation of the well known 2-port error correction procedure in each network analyzer.

The proposed de-embedding procedure can operate with all 2-port calibration methods in accord with the 10-term and the 7-term technologies, which, for example, have been described as starting points in the already mentioned documents DE 199 18 697 A1 and DE 199 18 960 A1. For the necessary calibration measurements up to the number k, as basis for the first error correction, it suffices if one has available the conventional standards for the 10 term or the 7 term procedures, for example, TMSO, TMR, or TLR. In these acronyms, T=through connection M=known impedance S=Short circuit O=open circuit L=Line R=Reflection Standard Advantageous concrete embodiments with the invented combinational 2-port calibration procedure are to be found in the subordinate claims 5 to 8.

There are four different network analyzer designs, which can be considered technically advantageous. In each of these designs, the invented procedure may be applied.

As a first, and most favorable from a price standpoint, is a network analyzer having three measuring positions. Two of the three measuring positions are respectively and directly joined to two inner ports, and the third measuring position can be joined with the two inner ports by a switch. A switching matrix connects the two inner ports of the network analyzer with the n outer ports and in this way realizes the k necessary signal paths. With this design, none of the known multiport calibration methods may be applied.

Going beyond the above, consideration can be given to a network analyzer as a quick, but not so economically favorable design, in which the n ports are connected by a switching matrix, but an inner port with n+1 measuring positions is lacking. Such a rapid design, for example, is more closely described in the DE 199 18 697 A1.

For these first two designs, in the procedure in accord with the invention, k 2-port-10-term methods are carried out. The requirements regarding the calibration standards are the same as that from the known multiport-10-term procedure of the DE 199 18 697 A1. What is new is the invented, additional determination of the magnitude of the reflection of the n ports in the inactive state, whereby, in the second case, the reflection magnitudes of the n ports in the inactive state can be set equal to the reflection magnitudes of the n ports in the active state. These first two designs can especially be applied with the proposed proceeding as outlined in the subordinate claim 5.

As a third design, and once again favorable in price, reference is made to a network analyzer with four measuring positions. In this case, respectively, two of the measuring positions are directly connected with respectively one of two inner ports of the network analyzer. As in the first design, the two inner ports of the network analyzer are connected through a switching matrix with the n outer ports of the thus realized multiport network analyzer. Also, for this design, none of the known multiport calibration procedures can be applied.

Finally, as an additional, again rapid but very expensive alternative, attention can be called to a network analyzer, wherein the n ports, absent a connected switching matrix, are bound directly with 2·n measuring positions. Such a design is more closely described in the DE 199 18 960 A1.

For the procedure in accord with the invention, for the two last stated designs, advantageously k 2-port-7-term procedures are executed. The requirements as to calibration standards and the number is the same as that of the DE 199 18 960 A1 known multiport calibration method, but the number of the contacts is different. What is new, is once again, for the determination of the reflection magnitudes of the n-ports in the inactive state, which determination is necessary for de-embedding, wherein, in the fourth design, the reflection magnitudes of the n ports in the active state can be set equal to the reflection magnitudes of the n ports in the active state. The 10-term-procedures can, in this design, also be applied, but requires, however, high quality and more numerous calibration standards and calibration related measurements. These designs can be applied, especially with one of the procedures proposed in the subordinate claims 6 to 8.

If, in a network analyzer, 2·n or n+1 measuring positions are provided, then the n ports can be connected directly, that means, they can be connected by the equivalent of a throw switch with the measuring positions. As alternative, it is possible that a switching matrix can be provided, which has the capability of connecting each of the n ports of the network analyzer respectively to at least one of the measuring positions with two inner ports of the network analyzer.

The n+1 or 2·n measuring positions can, in this case, also be integrated in the switching matrix. In this manner, a network analyzer requires only two inner ports, but possesses nevertheless n+1 or 2·n measuring positions.

The claims 6 to 8 link the application of the known 7-term, 2-gate calibration procedure with the names TAN, TNA, TRL, LLR, LRL, TAR. TMR, TRM, UMSO, TMN, LNN, TZU, TZY, TYU, LZY, ZZU, YYU, etc. where:
T=Through
R=Reflect
L=Line
A=Attenuator
M=Match
U=Unknown
S=Short
O=Open
N=Network
Z=Series Resistance
Y=Parallel Resistance.

For details of these procedures, reference is made to the dissertation publication already mentioned above. All these algorithms belonging to the class of the 7-term-process permit themselves, with their advantages, to be implemented in an invented network analyzer within the framework of the invented procedure. All of the procedures are used k-times in their classic application form. In accord with this, each 2-port standard must be contacted k-times and each 1-port standard must be contacted k-times. On this account, the procedure presented here, that is, the total calibration procedure departs clearly from the multiport 7-term calibration method as taught by DE 199 18 960 A1. In the case of multiport problems with more than three ports, procedures have greatest interest, which procedure contains the fewest 2-port standards, since k is much greater than n.

In the subordinate claims 7 and 8, the practically, very meaningful usage of the 7-term procedures TRL and TMR were emphasized. In the case of the very interesting TMR-DMV, a multitude of alternatives in the succession of the contacting of the 1-ports become available for selection upon the choice of the calibration standard combinations.

However, it is presupposed, that it is necessary to once connect all gates by means of a known 2-port connection (as a rule, a through binding T).

Further, at each port, a known impedance connection must be connected, i.e. a wave sink M, and a reflection standard R, the reflection behavior of which, at each port must be essentially equal, or not known.

In claim 9, in an extended manner, is proposed an advantageous possibility for the treatment of the device under test with differential and common mode at the contact terminals. In accord with this, the device under test is described, instead of by the customary scattering parameters for an unsymmetrical mode, with scattering parameters for the common and differential modes. The procedure distinguishes itself above the method used up to now with the ideal transformer, in that all dissipation mechanisms have an under-support as individual, physically recoverable quantities, thus clearly providing more information to the developers allowing them to improve their product in its electrical characteristics. With this embodiment of the invented procedure, devices such as SAW filter and balance devices (baluns) can be analyzed simply, quickly and in great detail.

The means of the invented circuit module are advantageously implemented in software. Further, the circuit module can show itself as a stand-alone new unit or as an available component in the current network analyzer, wherein the said module is additionally integrated.

BRIEF DESCRIPTION OF SEVERAL VIEWS OF THE DRAWINGS

In the following, the invention will be described and explained in greater detail, with the aid of the drawing. There is schematically shown in.

DETAILED DESCRIPTION OF THE INVENTION

First, embodiment examples of a network analyzer is described with the aid of FIGS. 1–5, which show an arrangement wherein the invented de-embedding procedure may be applied.

Figure 1:
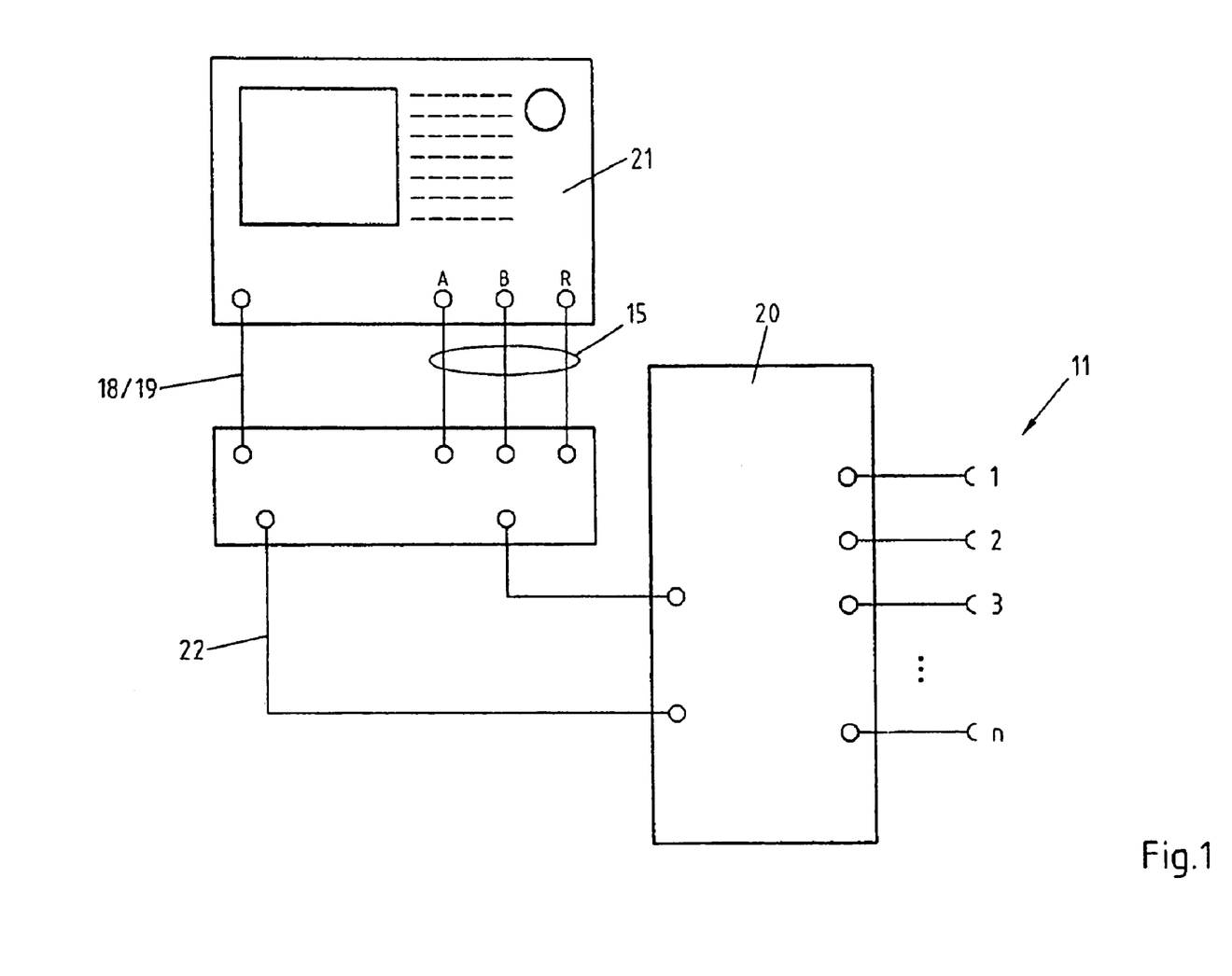
FIG. 1 a network analyzer with 3 measuring positions, 2 inner ports and n outer ports, FIG. 2 a network analyzer with 4 measuring positions, 2 inner ports and n outer ports, FIG. 3 a network analyzer with 3 measuring positions and n outer ports, FIG. 4 a network analyzer with 4 measuring positions and n outer ports, FIG. 5 a network analyzer with 2·n measuring positions and n outer ports, FIG. 6 the determination of active reflection factors in a network analyzer per FIG. 1

FIG. 1 presents a network analyzer with three measurement positions 15, two inner ports 22 and n outer ports 11. A service and operating unit 21 is connected to two inner ports 22 of the network analyzer by three measurement positions, namely A, B and R as well as by high frequency lines 18, 19. The two inner ports 22 are, on their own part, connected through a switching module 20 with n outer ports 11. Two of the measurement positions A and B capture back-running signals from the outer ports 11 and one of the measurement positions, i.e., R, picks up the signals directed to the outer ports 11. The high frequency supply lines 18, 19 are used to conduct incoming signals to the outer ports 11, whereby also a (not shown) reflectometer also guides the respective signal to the measurement position R for the waves directed to that point. The active and the inactive behavior of ports differ in this network analyzer. The two-fold error correction of measured parameters of a device under test is done in this network analyzer and in the network analyzers described in the following in the processing unit 21, in which also corresponding error terms for the first and the second correction are determined and stored. For such a network analyzer neither the known 7-term nor the 10-term multiport calibration procedure can be used. As a basis for the invented procedure, n 7-term 2-port calibration procedure can be used, however, the 10-term 2-port calibration method is also acceptable.

Figure 2:
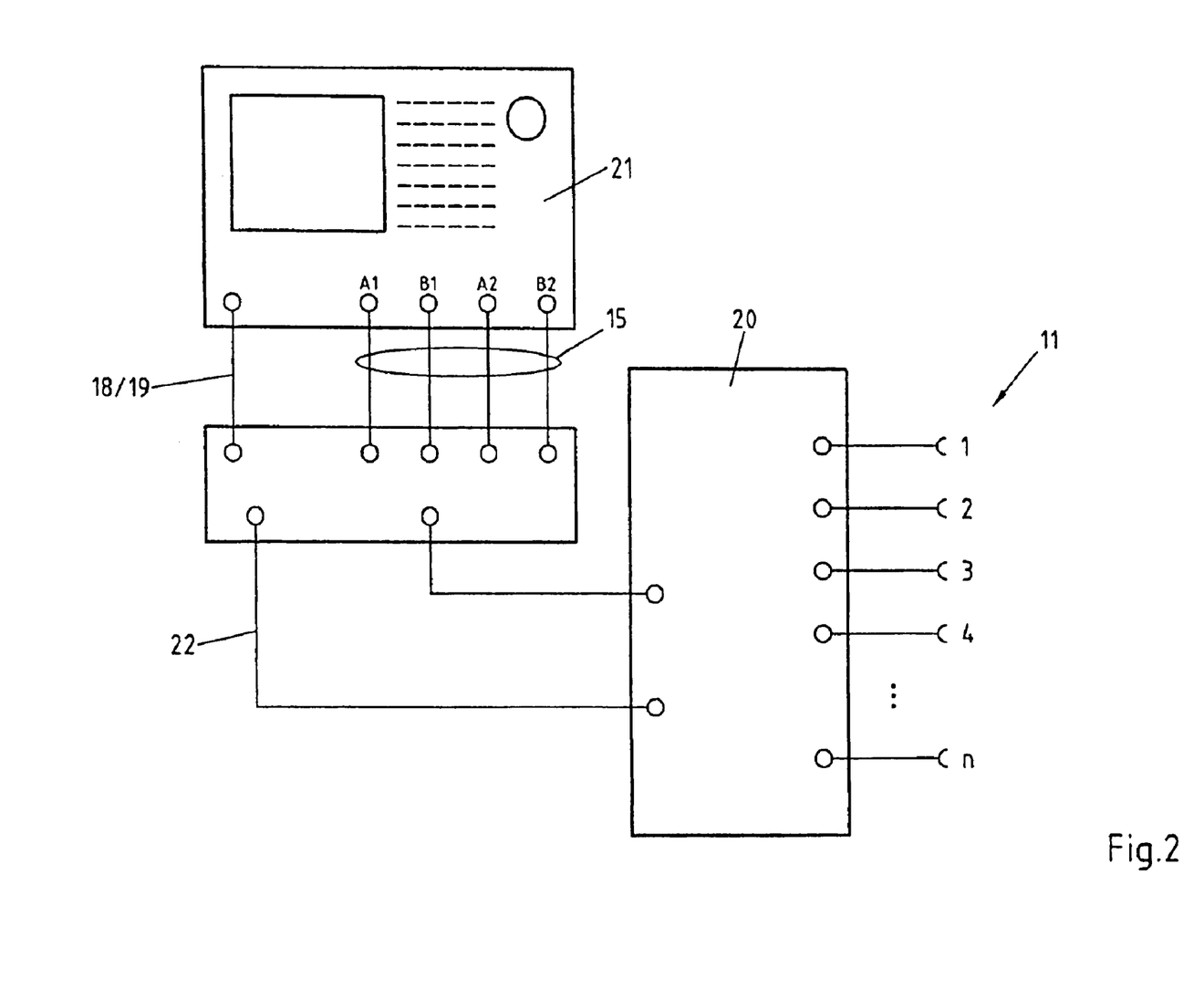

FIG. 2 brings forth a network analyzer with four measuring positions 15, two inner ports 22 and n outer ports 11. One service and processing unit 21 is connected by four measuring positions 15, namely A1, B1, A2, B2, and two high frequency feed lines 18, 19 with two inner ports 22 of the network analyzer. These inner ports 22 are in electrical communication with a switch module 20 having n external ports 11. The high frequency lines 18, 19 emit on their own part, signals traveling to the external ports 11. Since, in this case, four measuring positions are provided, it is possible, that additionally, within the equipment, reflected waves can be captured. The active and the inactive behavior of ports are, once again, different. Also, in this case, neither the known 7-term nor the known 10-term-multiport calibration method has been applied. However, as a basis for the invented procedure, because of the possibility of the capture of the reflected waves within the equipment, both the 10-term-2-port calibration procedure as well as the 7-term 2-port calibration procedure must be given consideration.

FIG. 3 presents, once again, a network analyzer with three measuring positions 15 and n external ports 11. In this case, a service and processing unit 21 is connected by the three measuring positions 15, these being A, B, and R. The high frequency lines 18, 19 are directly bound to a switch module 20. The switch module 20 makes possible a direct connection between the measurement position 15 and the n outer ports 11. Contrary to the network analyzers of the FIGS. 1 and 2, the inactive and the active behavior are identical. In this design, the known 10-term-multiport procedure could be employed. As a basis for the invented procedure, once more, no 7-term, 2-port calibration method can be used, but however, again the 10-term, 2-port calibration system is acceptable.

Figure 3:
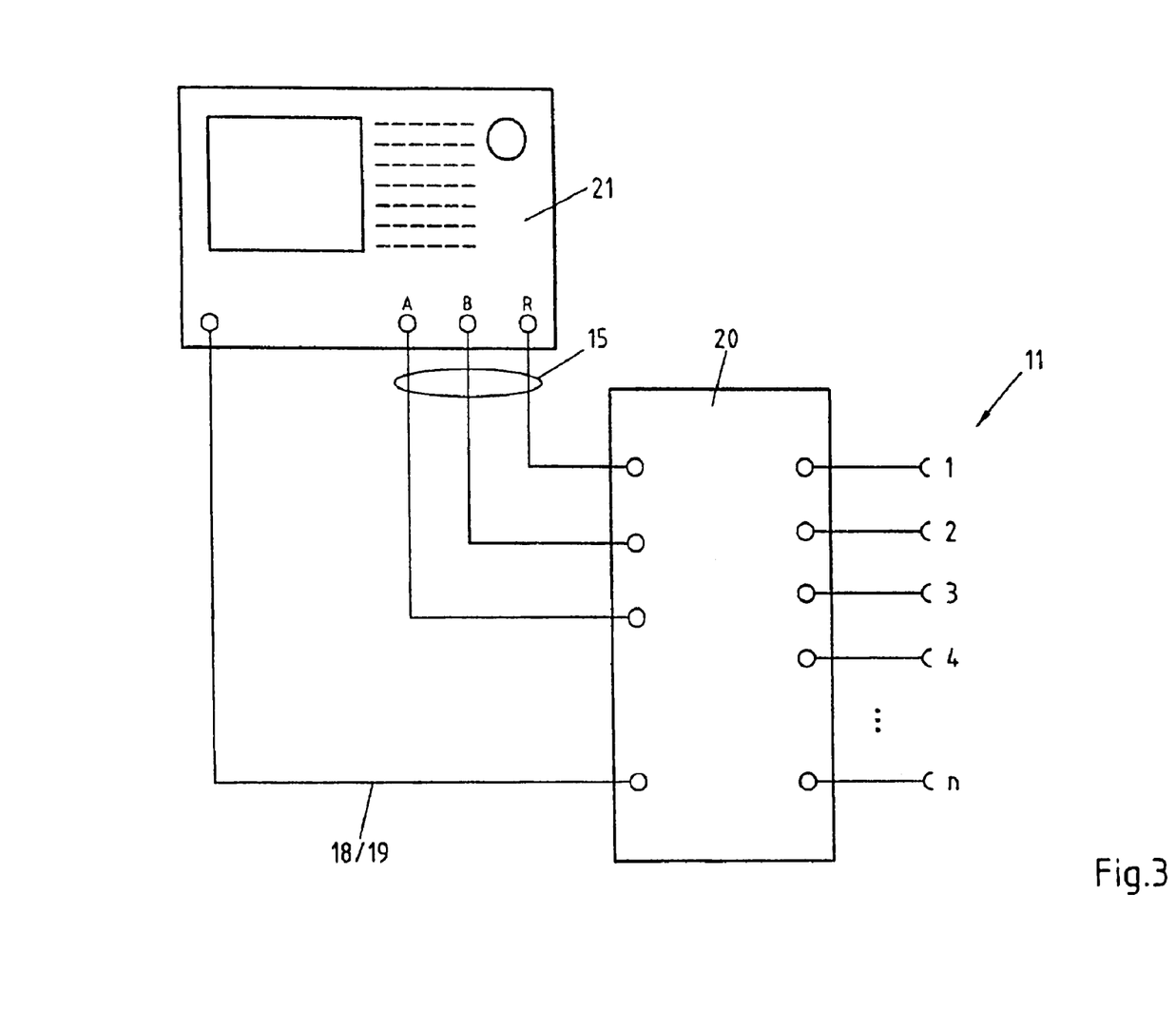
Figure 4:
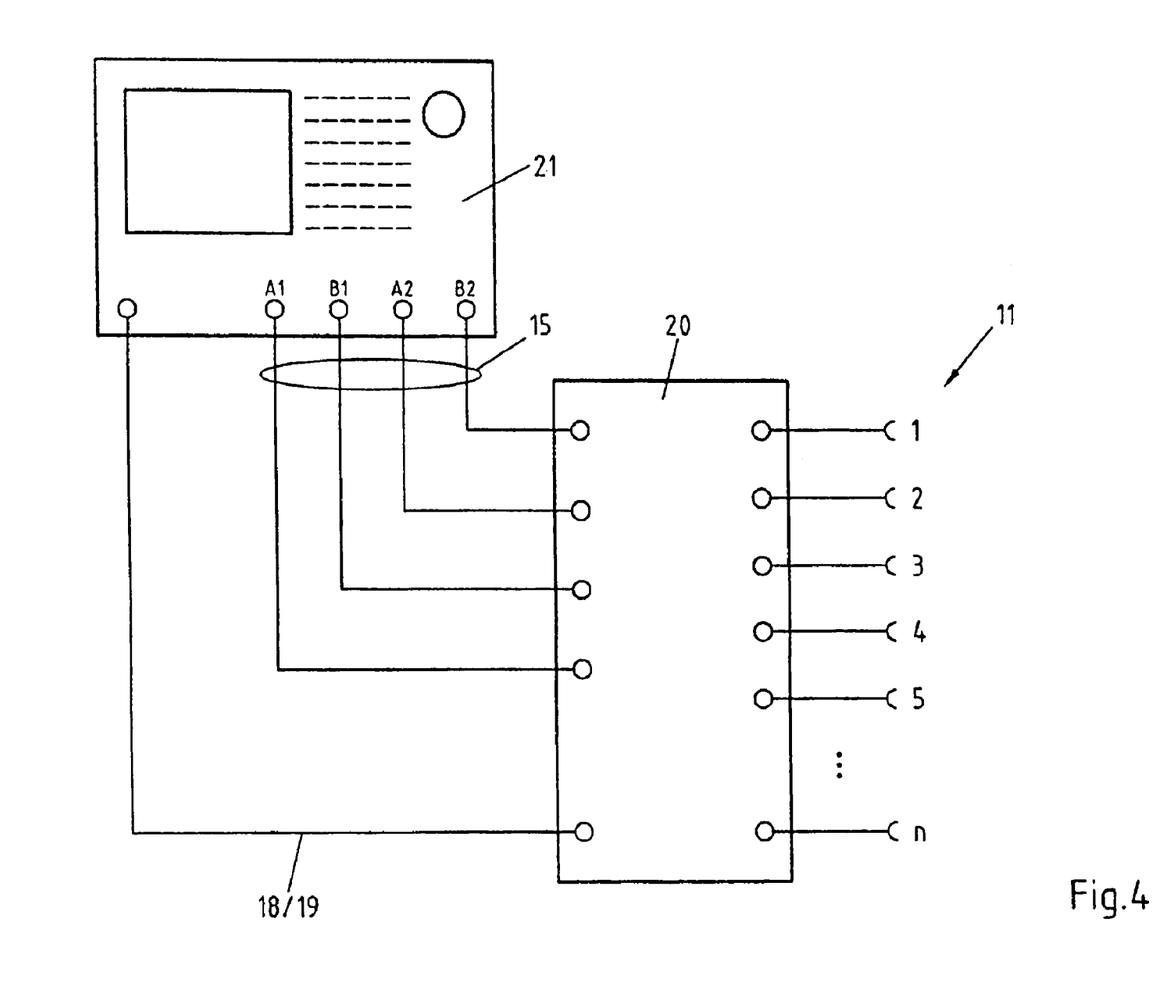

FIG. 4 presents, similarly to the network analyzer of FIG. 3, a network analyzer in which the measuring positions 15 and the high frequency lines 18, 19 run directly to a switch module 20 with n outer ports 11. In FIG. 4 are provided, in any case, once again four measuring positions 15, namely A1, B1, A2, B2. Alternately, also n+1 measuring positions could be provided. As in the case of the network analyzer of FIG. 3, the inactive and the active behavior is identical. In this design, besides the known 10-term, multiport procedure, also the 7-term, multiport procedure can be applied. As in the case of the network analyzer of FIG. 2, as a basis for the invented procedure in addition, consideration is given to both the 7-term, 2-port calibration procedure as well as the 10-term, 2-port calibration procedure.

Figure 5:
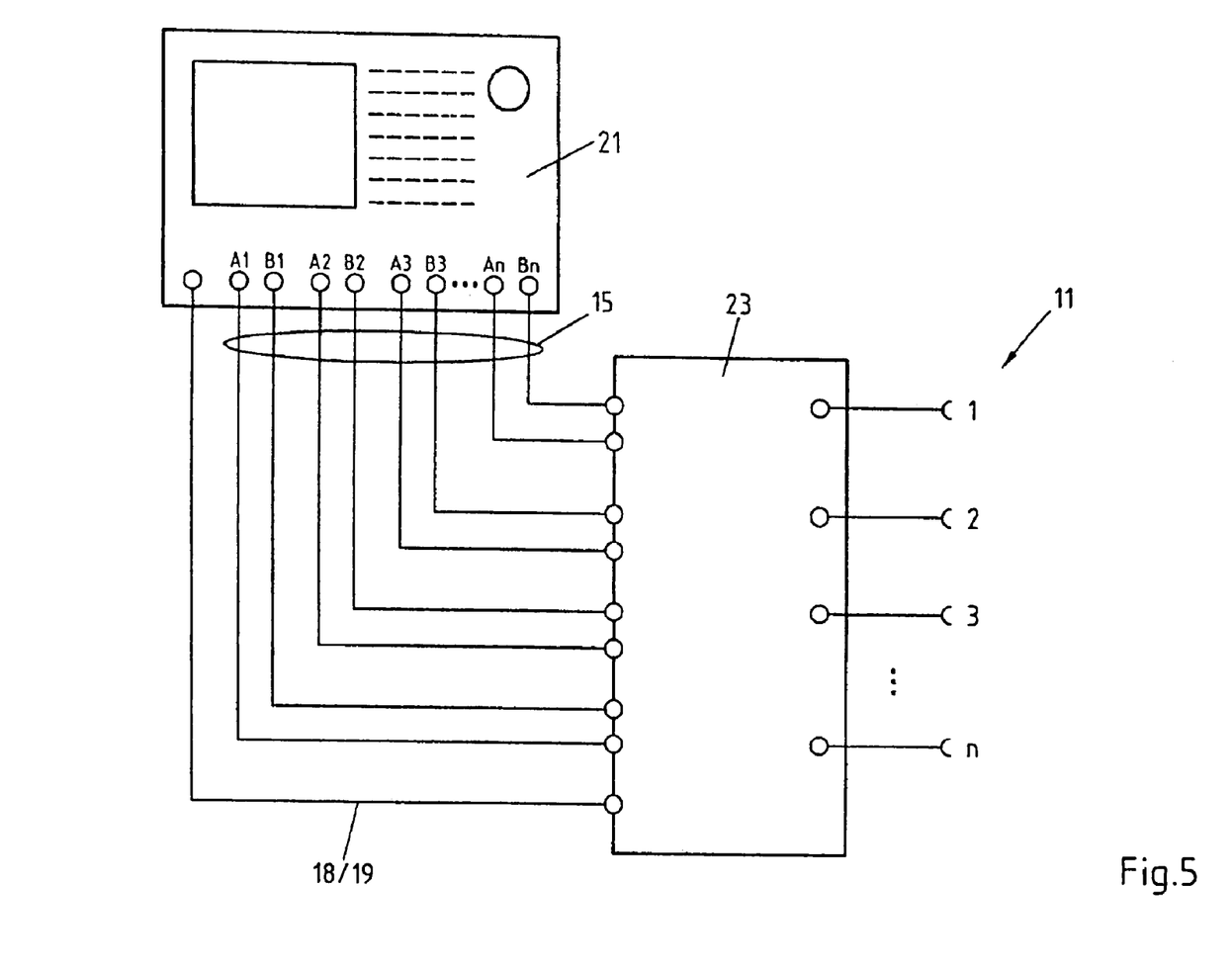

Finally, in FIG. 5, we see a network analyzer, wherein a service and processing unit 21 is connected with 2·n measuring positions, in detail, these being A1, B1, An, Bn, and by a high frequency cable directly to a connection module 23. This connection module 23 enables a connection of the measuring positions 15 with the n outer ports 11 without any switching action, since for each outer port 11, one measurement position A1 to An is provided for thereto directed waves and a measuring position B1-Bn is provided for backflow waves. As in the two network analyzers from FIG. 3 and FIG. 4, the inactive and the active behavior is identical. Also, with this design, the known 10-term, multiport procedure and the known 7-term multiport procedure can be applied. As a basis for the invented procedure, both the 7-term, 2-port calibration procedure and the 10-term, 2-port calibration procedure can be employed.

Figure 6:
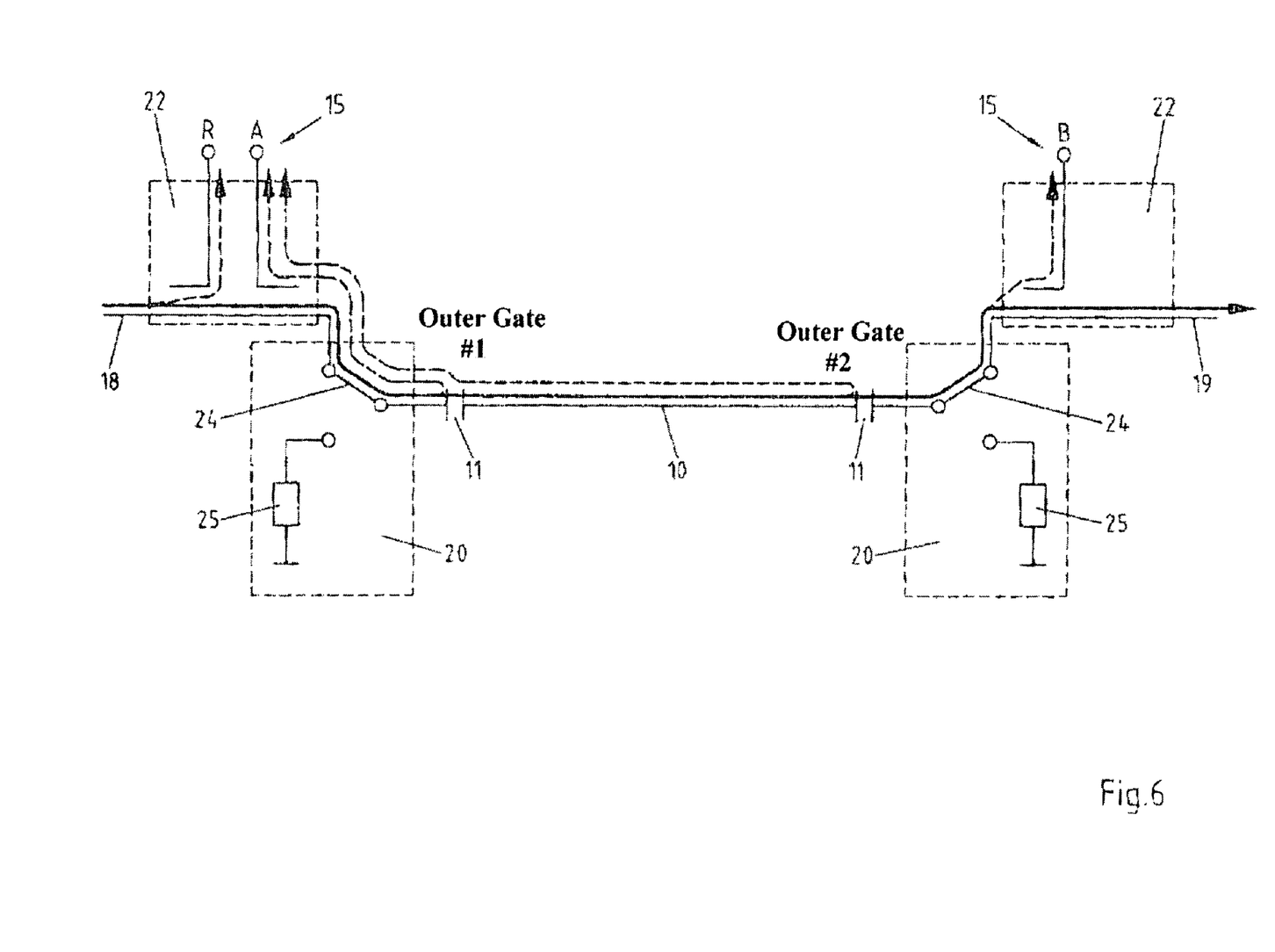

FIG. 6 demonstrates schematically the known determination of active reflection factors by 2-port measurings in a network analyzer such as seen in FIG. 1. FIG. 7 shows, again schematically the invented determination of inactive reflection factors by 2-port measuring in a network analyzer such as presented in FIG. 1. In both figures, the same section from a network analyzer with a built-in calibration standard 10 is shown.

Figure 7:
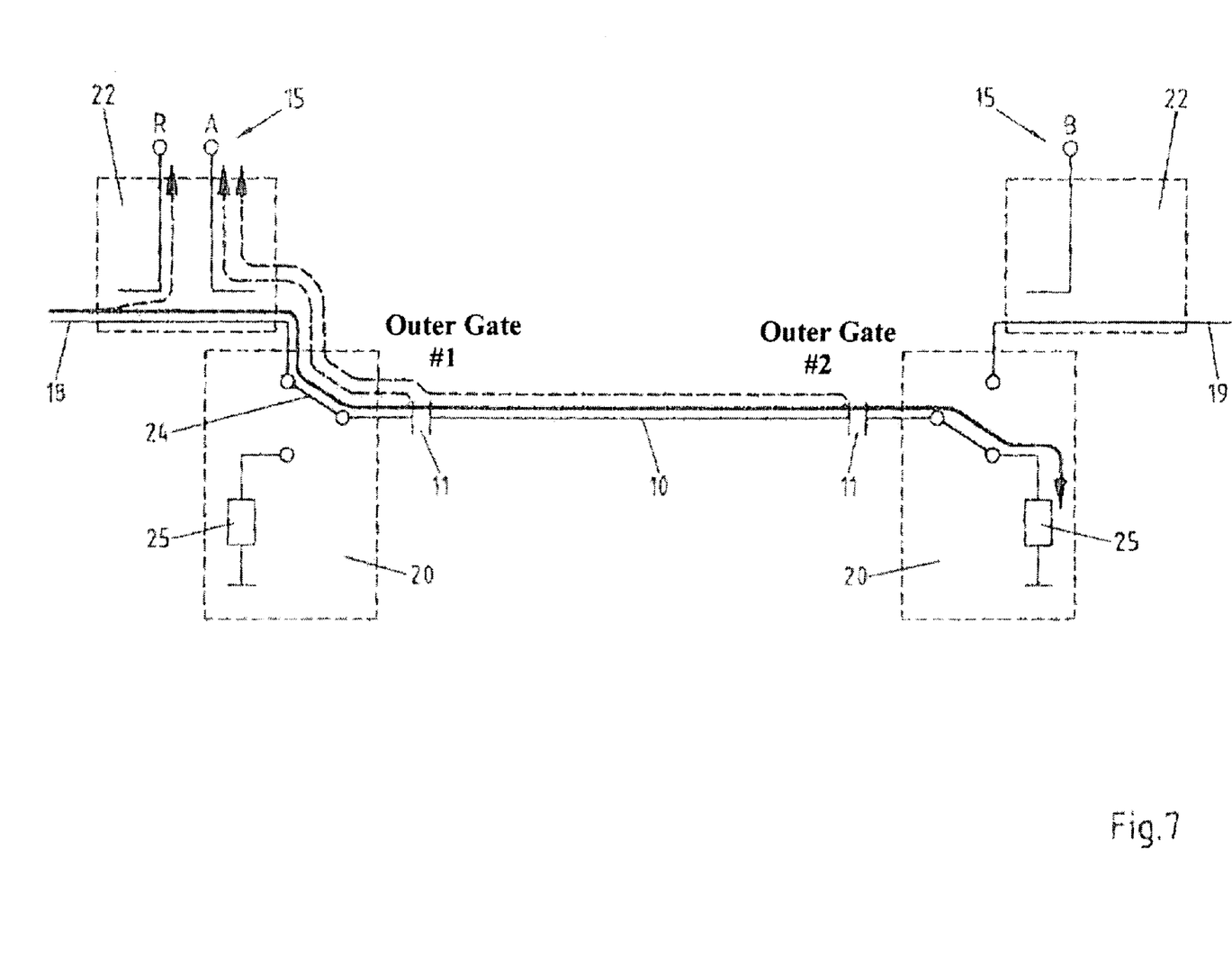
FIG. 7 the determination of inactive reflection factors in a network analyzer per FIG. 1, and in FIG. 8 a block circuit diagram of a network analyzer in accord with FIG. 2, for which the second error correction of dispersion parameters has been made clear.

In the two FIGS. 6 and 7, one of the high frequency lines 18 is connected through a first inner port 22 and through the switch module 20 to a first outer port 11 of the n outer ports. By an inserted through connection 10 serving as a calibration standard, the first outer port 11 is connected with a second of the n outer ports. The two ports 11 form a 2-port to be measured. The second outer port 11 is, by the switch module 20 and by the second inner port 22 connected with the second high frequency supply line 19. In the switch module 20 is provided a first switch 24, for a switchable connection between the first inner port 22 and the first outer port 11, which can connect the first inner port 22 either with the first outer port 11 or to ground by means of a resistance 25. A corresponding second switch 24 is provided in the switching module 20 for a switchable connection between the second inner port 22 and the second outer port 11. Further presented, are the three measuring positions 15 which are connected to the two inner ports 22. The measuring position R, in this arrangement, by means of a reflectometer is capable of capturing the oncoming waves which are approaching the first outer port 11. Similarly, the measuring position A is likewise capable of capturing the back flowing waves from the outer port 11. The measuring position B captures the waves coming from the second outer port 11.

Next, the determination of active reflection factors will be explained with reference to FIG. 6. For the determination of the active reflection factors of the second outer port 11, the first outer port 11 serves as a sender and the second outer port serves as a receiver. In this regard, for one thing, in the switching module 20, by means of the first switch 24, a connection is established between the first inner port 22 and the first outer port 11, and by means of the second switch 24 a connection is brought about between the second outer port 11 and the second inner port 22.

Subsequently, by means of the first high frequency line 18, a signal is sent over the first inner port 22 and the switching module 20 onto the first outer port 11. As this happens, the measuring position R captures a measured value for the signal. A portion of the approaching signal to the first outer port 11 is immediately reflected and directed back through the switching module 20 and guided to the first inner port 22 of the measuring position A. The non-reflected part of the signal is conducted through the calibration standard 10 to the second outer port 11. At this second outer port 11, another portion of the signal is reflected and travels over the first outer port 11, the switch module 20 and the first inner port 22, likewise guided to the measuring position A. The remaining residual signal is conducted over the second outer port 11, the switching module 20 and the second inner port 22 on the second high frequency line 19, whereby the measuring position B picks up this portion of the signal.

In the same manner, according to connection, the second outer port 11 can serve as sender, and the first outer port 11 can be the receiver, in order that the corresponding measurement values for the active reflection factor of the first outer port 11 can be determined. The measurement position R is, for this purpose, is so switched, that it is capable of capturing the waves approaching the second outer port 11. From the captured values obtained from the measurement positions 15, in a known manner, the active reflection factors of the two outer ports 11 can be determined.

The determination of inactive reflection factors in the case of a network analyzer, wherein the active and inactive behaviors are different, will now be explained with reference to FIG. 7. Such a determination is not known in conventional calibration procedures. For the determination of the inactive reflection factors, once again, at the beginning the first outer port 11 plays the role of sender, the second outer port, on the other hand is shut off. For the shutting off, in the switching module 20, the second switch 24 is so positioned, that it connects the second outer port 11 with the second resistance 25 instead of with the second inner port 22.

Under these circumstances, then a renewed signal is sent over the first high frequency line 18 to the first outer port 11. A first portion of the signal is again reflected to the first outer port 11 and an additional portion is sent to the second outer port 11. The second reflected portion differentiates itself however, from the second reflected portion of the signal in FIG. 6, since the signal at the second outer port 11 now, because of the changed position of the second switch 24 is directed to a terminal resistance 25, instead of through the second inner port 22 on the second high frequency line 19.

The capture of the approaching and the reflected waves corresponds to that shown in FIG. 6, only that in this case, that is, no signal reaches the measurement position B, since the connection to this measurement position has be interrupted. However, from the measured values at the measurement positions A and R, now a reflection factor for the second outer port 11 in the inactive state can be determined. Additionally, the determined inactive reflection factor, with the availability of the measurement values for the active reflection factors, can be subjected to an error correction, in order to set aside the influence of the calibration standard 10 between the outer ports 11 from the said reflection factor.

For the determination of the reflection factor for the first measurement position 11 in the inactive state, the procedure is renewed in the opposite direction and carried out with inverted switch positioning.

Figure 8:
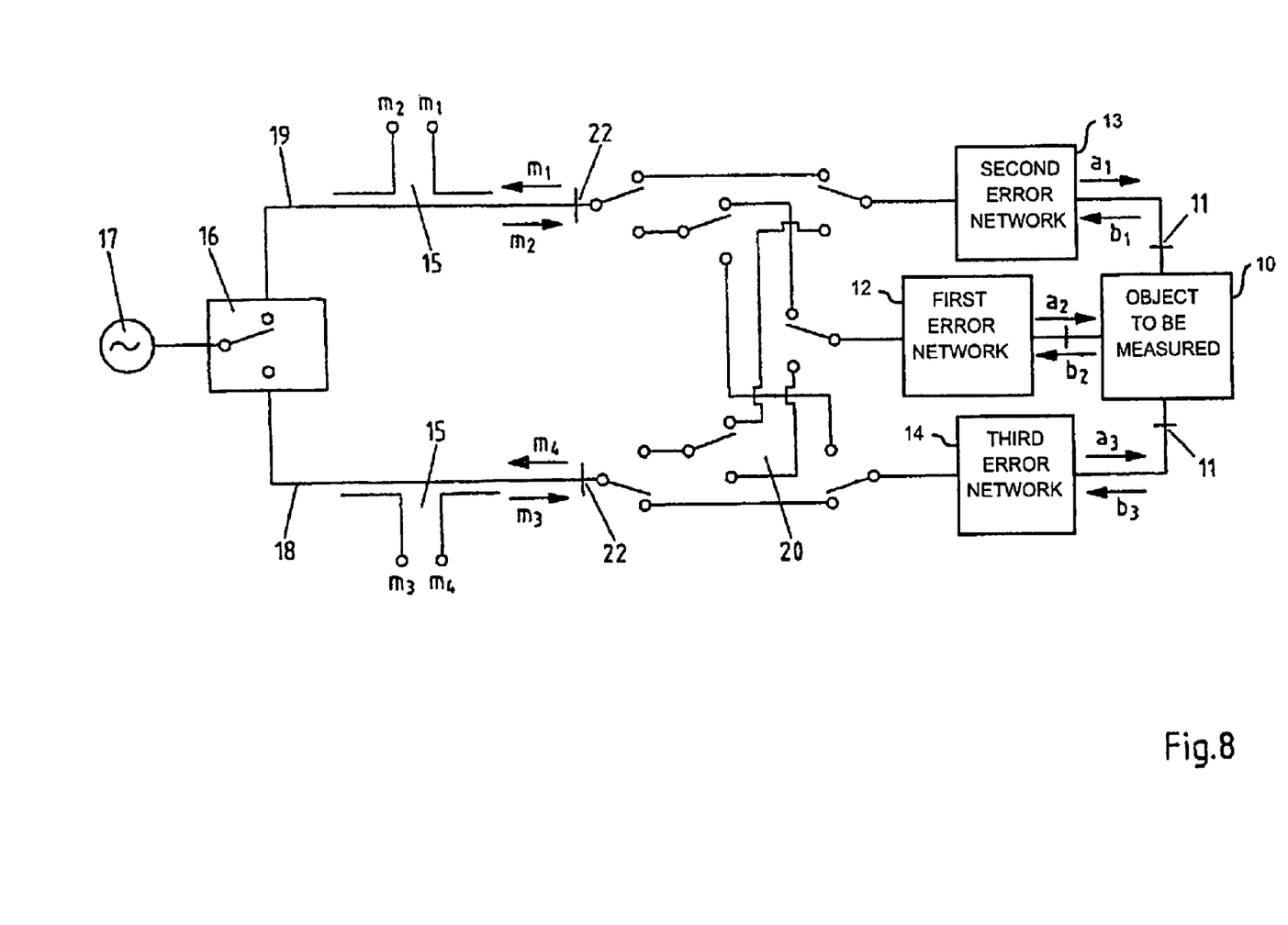

The general problem of n-ports is often reduced to 3-ports for the sake of clarity. Likewise, FIG. 8 shows, for example, a 3-port multi-port network analyzer. The multi-port network analyzer in the figure, corresponds to that in the introductory passages of the description as an already mentioned third practical, relevant design network analyzer, that is, the network analyzer of FIG. 2.

The network analyzer of FIG. 8 possesses a signal source 17, which is connected to a real switch 15 with two branches, 18, 19. Each of the line branches 18, 19 is respectively assigned to connections, which are two assumed ideal measurement positions 15, namely, m1, m2, or m3, m4. Both conductor lines 18, 19 can be electrically joined through an inner port 22 and a common switching matrix 20 by likewise assumed ideal switches with one optional selection of first error network 12, second error network 13, and third error network 14. The switching matrix 20 represents herein, the real switching module from FIG. 2. Each of the three error networks 12, 13, 14 is finally connected with a port 11 with a measured DUT 10 (DUT=Device Under Test=measured object). The device under test can, in one instance, be an object, the reflection parameters and transmission parameters of which are to be determined. Additionally, various calibration standards are applied for the error-correction of determined scattering parameters.

When a signal, the characteristics of which, such as reproducibility, durable stability, etc., are not yet exact, is emitted from source 17, it enters a switch module 16 and is diverted to one of the two line branches 18, 19, by which it is conducted to an inner port 22. By means of the switching matrix 20, the signals to the ports 11 of the device under test 10, after a reflection to, or a transmission through, said measured device 10, the signals are returned again back to the line branches 18, 19. The waves which are approaching the device under test 10 are designated with $a_1$, $a_2$, $a_3$ and the waves departing from the device under test 10 are designated $b_1$, $b_2$, $b_3$, whereby the same index is assigned to the corresponding port 1, 2, 3. The accumulated errors of the switching matrix 20, the measurement positions 15, and the connection cable 18, 19 are combined in the respective error-matrices of the error-network 12–14.

For the determination of the scattering parameters of a connected device under test 10, one of the measurement positions $m_2$ or $m_3$ takes a measure at one of the line branches 18, 19 for the approaching wave, and the measurement positions $m_1$, $m_4$ take at the corresponding line branch 19, 18 a measurement for the back fed, rejected or transmitted waves.

Next, the network analyzer is subjected to a 7-term 2-port calibration procedure, in order to make available error-terms for a first error correction of scattering parameters. Corresponding to the description in respect to FIG. 7, then for a second error-corrective measure, the error-free reflection factors $r_{ii}$(1=1–3) of the three ports are determined in the inactive state, where i=1 is assigned to the first port, i=2 is assigned to the second port and i=3 is assigned to the third port.

In this connection, it is possible for a device under test to have the scattering parameters determined as rough measured values and an initial error correction to be undertaken on the basis of the error-term of the 7-term, 2-port calibration procedure. The measured and one-time corrected scattering parameters build the nine values of a 3×3 scattering matrix and are designated by: $s_{ij}^m$ where (i=row 1–3; j=column 1–3).

From the one-time corrected scattering parameters of the device under test, and the inventively determined and error-free reflection factors $r_{ii}$ it is now possible to determine the "true" scattering matrix [S] of the device under test 10 with three measuring ports 11 in the equation:

$$\begin{pmatrix} b_1 \\ b_2 \\ b_3 \end{pmatrix} = \underbrace{\begin{pmatrix} S_{11} & S_{12} & S_{13} \\ S_{21} & S_{22} & S_{23} \\ S_{31} & S_{32} & S_{33} \end{pmatrix}}_{[S]} \begin{pmatrix} a_1 \\ a_2 \\ a_3 \end{pmatrix} \quad (1)$$

It is now permissible to simply formulate, for a 3-port multi-port-network-analyzer, by the known signal-flow method, the equations for the de-embedded scattering parameters, as follows:

$$S_{11} = S_{11}^m - S_{13}^m S_{31}^m \frac{r_{33}}{1 - r_{33} S_{33}^m} - S_{12}^m S_{21}^m \frac{r_{22}}{1 - r_{22} S_{22}^m} \quad (2)$$

$$S_{22} = S_{22}^m - S_{12}^m S_{21}^m \frac{r_{11}}{1 - r_{11} S_{11}^m} - S_{23}^m S_{32}^m \frac{r_{33}}{1 - r_{33} S_{33}^m} \quad (3)$$

$$S_{33} = S_{33}^m - S_{13}^m S_{31}^m \frac{r_{11}}{1 - r_{11} S_{11}^m} - S_{23}^m S_{32}^m \frac{r_{22}}{1 - r_{22} S_{22}^m} \quad (4)$$

$$S_{12} = S_{12}^m - S_{32}^m S_{13}^m \frac{r_{33}}{1 - r_{33} S_{33}^m} \quad (5)$$

$$S_{13} = S_{13}^m - S_{12}^m S_{23}^m \frac{r_{22}}{1 - r_{22} S_{22}^m} \quad (6)$$

$$S_{21} = S_{21}^m - S_{31}^m S_{23}^m \frac{r_{33}}{1 - r_{33} S_{33}^m} \quad (7)$$

$$S_{23} = S_{23}^m - S_{13}^m S_{21}^m \frac{r_{11}}{1 - r_{11} S_{11}^m} \quad (8)$$

$$S_{31} = S_{31}^m - S_{32}^m S_{21}^m \frac{r_{22}}{1 - r_{22} S_{22}^m} \quad (9)$$

$$S_{32} = S_{32}^m - S_{31}^m S_{12}^m \frac{r_{11}}{1 - r_{11} S_{11}^m} \quad (10)$$

Likewise, the equations for an n-port can be determined, whereby the terms of higher orders are generated, which contain two and more $r_{ii}$—values. These can, however, be disregarded by good approximation approaches, since the $r_{ii}$—values are small, so that each correction computation is given in the form of the solution found under equation (2). For example, for a 4-port, we have:

$$S_{11} = S_{11}^m - S_{13}^m S_{31}^m \frac{r_{33}}{1 - r_{33} S_{33}^m} - S_{12}^m S_{21}^m \frac{r_{22}}{1 - r_{22} S_{22}^m} \quad (11)$$

In the following, it shall now be presented, how, with the availability of the determined scattering parameter values of a 3-port, the multimode value of a 2-port, which encompasses an unsymmetrical entry as well as a two conductor line system, by which a common and a differential mode occur, can be obtained. The 2-port, with the unsymmetrical entry can be, for example, a micro strip line and the two-line system, for instance can be a two-line system with two parallel micro strips.

This procedure is especially of interest where SAW-filter and symmetrical members are concerned, since here, in contrast to the known procedure, the loss mechanisms are separated.

The unsymmetrical port is in FIG. 8 the port 1 with the incoming wave $a_1$, and the departing wave $b_1$. The two other ports for the two-line system are the ports 2 and 3 with the wave magnitudes $a_2$, $a_3$, $b_2$, $b_3$. The de-embedded dispersion for the three ports is given.

On the two-line system, occur a common mode wave and a differential mode wave, which can be described with the values: $a_2^+$, $a_2^-$, $b_2^+$, $b_3^-$. The key for the multimode computation is now, that in a linear system, the mode of the unsymmetrical measurement system allows itself to be joined with the two-line system, as follows:

$$a_2^+ = \frac{1}{\sqrt{2}} (a_2 + a_3) \quad (12)$$

$$a_2^- = \frac{1}{\sqrt{2}} (a_2 + a_3) \quad (13)$$

$$b_2^+ = \frac{1}{\sqrt{2}} (b_2 + b_3) \quad (14)$$

$$b_2^- = \frac{1}{\sqrt{2}} (b_2 + b_3) \quad (15)$$

If one evaluates the equations and defines new scattering parameters from the usual topography with the wave magnitudes a and b, but with the mode-considerations, whereby an "0" designates the unsymmetrical mode, then there arises the following nine scattering parameters for the 2-port with the unsymmetrical entry and the symmetrical exit.

The intrinsic parameter for the unsymmetrical mode:

$$S_{11} = S_{11} \quad (16)$$

The intrinsic parameter for the common mode:

$$S_{22}^+ = \frac{1}{2}(S_{22} + S_{23} + S_{32} + S_{33}) \quad (17)$$

Intrinsic parameter for the differential mode:

$$S_{22}^- = \frac{1}{2}(S_{22} - S_{23} - S_{32} - S_{33}) \quad (18)$$

Conversion parameter for the common mode in the unsymmetrical mode:

$$S_{12}^{+0} = \frac{1}{\sqrt{2}}(S_{12} + S_{13}) \quad (19)$$

Conversion parameter for the differential mode in the symmetrical mode:

$$S_{12}^{-0} = \frac{1}{\sqrt{2}}(S_{12} - S_{13}) \quad (20)$$

Conversion parameter for the unsymmetrical mode in the common mode $$S_{21}^{0+} = \frac{1}{\sqrt{2}}(S_{21} + S_{31}) \quad (21)$$

Conversion parameter for the unsymmetrical mode in the differential mode:

$$S_{21}^{0-} = \frac{1}{\sqrt{2}}(S_{21} - S_{31}) \quad (22)$$

Conversion parameter for the common mode in the differential mode:

$$S_{22}^{+-} = \frac{1}{2}(S_{22} + S_{23} - S_{32} - S_{33}) \quad (23)$$

Conversion parameter for the differential mode in the common mode:

$$S_{22}^{-+} = \frac{1}{2}(S_{22} - S_{23} + S_{32} - S_{33}) \quad (24)$$

Even when the somewhat more closely carried out description of a device under test with unsymmetrical modes by means of separate scattering parameters for the common and the differential modes, is based here on the invented corrected scattering parameters, it is also possible that an application of this or a corresponding description could be based on scattering parameters otherwise determined.

What is claimed is:

1. A process for correcting errors by de-embedding of scattering parameters measured with an n ports comprising vector network analyzer, of a device under test connected with the ports, said process comprising:

performing up to $$k = n \cdot \frac{n-1}{2}$$

2-port calibrations on different calibration standards switched onto the ports in an active state in optional succession as a basis for a first error correction of measured scattering parameters of a device under test, wherein n is an integer greater than 1; and determination of reflection parameters of at least some of the n ports in an inactive state with the availability of results from 2-port measurements on at least one calibration standard switched onto the ports in the active state and/or the inactive state as a basis for a second error correction of at least a part of the measured scattering parameters corrected with the first error correction of the device under test.

2. The process of claim 1, wherein the determination of the reflection parameters of at least a part of the n ports is carried out with the up to k 2-port calibrations, which became available in measuring steps for the first error correction.

3. The process of claim 1, wherein the reflection parameters of all n ports are determined in the inactive state.

4. The process of claim 1, wherein in a further step, to determine the scattering parameters of a device under test, the scattering parameters are subject to a first error correction on the basis of the up to k 2-port calibrations, and the thus corrected scattering parameters, at least partially, undergo a second error correction on the basis of the determined reflection parameters of ports in the inactive state.

5. The process of claim 1, wherein the network analyzer for the measurement of the calibration standard possesses at least three measurement positions connected with, or connectable to, the ports and by which network analyzer, in combination with available coaxial or planar calibration standards for the 2-port calibrations as a basis for a first error correction, the following steps are realized and carried out:

first, up to k calibration measurements are taken on respectively one 2-port, which is realized by means of the direct connection of two ports, or by means of a short matching line of known length and of known damping, which said line is connected between the k possible port combinations, a further calibration measurement is made on an n−1-port, which is realized by means of n known impedances, and a further calibration measurement is made on an n−1-port, which is realized by means of n known short circuits, and an additional calibration measurement is made on an n−1-port, which is realized by means of n known open circuits, whereby the value of the parameter n represents the number n of the ports.

6. The process of claim 1, wherein the network analyzer for the measurement of the calibration standards possesses at least four measurement positions connected to, or connectable to, the ports, and wherein in combination with available coaxial or planar calibration standards, as a basis for the first error correction the calibration standards of all known 7-term procedures between the ports in all k possible combinations are measured in optional succession.

7. The process of claim 1, wherein the network analyzer for the measurement of the calibration standards possesses at least four measurement positions connectable to, or connected to the ports and wherein in combination with available coaxial or planar calibration standards as a basis for the first error correction, the following steps are realized and carried out:

first up to k calibration measurements are made on respectively one 2-port, which is realized by means of the direct connection of the ports, or by means of a short matching line of known length and known transmission characteristics which said line is connected between the k possible port combinations, further additional calibration measurements are made on respectively one 2-port, which is realized by means of a short, matching line of unknown length and with unknown transmission characterizations, wherein the line is connected between the possible k port combinations, and a further calibration measurement is made on an n−1-port, which is realized by means of n non-ideal short circuits or open circuits whereby the value of the parameter n represents the number n of the ports.

8. The process of claim 1, wherein the network analyzer for the measurement of the calibration standards possesses at least four measuring positions connected to, or connectable to, the ports, and wherein, in combination with available coaxial or planar calibration standards as a basis for a first error correction, the following steps are realized and carried out:

the up to k calibration measurements are made on respectively one 2-port, which is realized by means of the direct connection of the ports or by a short matching line of known length and known transmission characteristics, which said line is connected between the k possible port combinations, a further calibration measurement is made on a n−1-port, which is realized by means n-known impedances, and an additional calibration measurement is made on a n−1-port, which is realized by means of n, non-ideal, short circuits or open circuits whereby the value of the parameter n represents the number n of the ports.

9. The process of claim 1, with the usage of known coaxial or planar calibration standards, and which procedure further comprises the steps:

measuring the scattering parameters of a device under test which exhibits symmetrical and unsymmetrical modes and which device under test is connected with the ports of the network analyzer, correcting the measured scattering parameters with a first error correction on the basis of the up to k 2-port calibrations and a second error correction on the basis of the determined reflection parameters, resulting in two-fold corrected scattering parameters Sij, where i,j=1 to n, whereby the respective second index identifies the port, through which a respective wave is entered in the device under test, and the respective first index identifies the port, through which the respective wave departs from the said device under test, and the determining of separate scattering parameters for the common and the differential mode of the device under test from the measured and two-fold corrected scattering parameters $S_{ij}$, whereby, for a symmetrical exit of the device under test connected to an arbitrary port i and j, the intrinsic parameters for the common mode are determined to $$\frac{1}{2}(S_{ii} + S_{ij} + S_{ji} + S_{jj})$$

and the intrinsic parameters for the differential mode are determined to $$\frac{1}{2}(S_{ii} - S_{ij} - S_{ji} + S_{jj})$$

the conversion parameters for the common mode in the differential mode are determined to $$\frac{1}{2}(S_{ii} + S_{ij} - S_{ji} - S_{jj}),$$

and the conversion parameters for the differential mode in the common mode are determined to $$\frac{1}{2}(S_{ii} - S_{ij} + S_{ji} - S_{jj}).$$

10. A vector network analyzer for the determination of the scattering parameters of a device under test, with n ports for the connection of the device under test and calibration standards as well as having at least 3 measuring positions, whereby each port is connected with, or connectable to at least one measuring position for the capture of wave magnitudes of signals approaching the port and connected with, or connectable to a measuring position for the capture of wave magnitudes of signals departing from the port as well as processing means for the carrying out of the process of claim 1.

11. The vector network analyzer of claim 10 with exactly three measuring positions, characterized by two inner ports connected through a switch with said three measuring positions and a switch module, which has the capability of connecting the n-ports through the two inner ports with the said three measuring positions.

12. The vector network analyzer of claim 10 with exactly four measuring position, characterized by two inner ports connected with two of the four measuring positions and a switch module, which has the capability of connecting the n ports through the two inner ports with the four measuring positions.

13. The vector network analyzer of claim 10 with n+1 measuring positions characterized by one switch module, by means of which each of the n ports can be, or is, respectively directly connected at least with one of the n+1 measuring positions.

14. The vector network analyzer of claim 10, with 2·n measuring positions characterized in that, each of the n ports is directly connected with respectively two of the 2·n measuring positions.

* * * * *